United States Patent [19]

Okuno et al.

[11] Patent Number: 4,999,698
[45] Date of Patent: Mar. 12, 1991

[54] INTERCONNECTION ARRANGEMENT FOR A GATE ARRAY

[75] Inventors: Yoshihiro Okuno; Yohichi Kuramitsu, both of Hyogo, Japan

[73] Assignee: Mitsubishi Denki Kabushiki Kaisha, Tokyo, Japan

[21] Appl. No.: 394,329

[22] Filed: Aug. 16, 1989

[30] Foreign Application Priority Data

Aug. 18, 1988 [JP] Japan .............................. 63-205571

[51] Int. Cl.$^5$ ........................................... H01L 27/10
[52] U.S. Cl. ...................................... 357/45; 357/41; 357/42
[58] Field of Search ............. 357/42, 45, 45 M, 71 P, 357/41

[56] References Cited

U.S. PATENT DOCUMENTS

| | | | |
|---|---|---|---|
| 4,651,190 | 3/1987 | Suzuki et al. | 357/42 |
| 4,771,327 | 9/1988 | Usui | 357/42 |
| 4,884,118 | 11/1989 | Hui et al. | 357/45 |

FOREIGN PATENT DOCUMENTS

| | | | |
|---|---|---|---|
| 0177336 | 4/1986 | European Pat. Off. | 357/45 M |
| 60-56292 | 12/1985 | Japan . | |

OTHER PUBLICATIONS

Blumberg et al., "A 640K Transistor Sea-Of-Gates 1.2μ Micron HCMOS Technology," *Digest of Technical Papers IEEE International Solid-State Circuits Conference*, Feb. 17, 1988, pp. 74-75.
Okabe et al., "A 400K-Transistor CMOS Sea-of-Gates Array with Continuous Track Allocation," *IEEE Journal of Solid-State Circuits*, vol. 24, No. 5, Oct. 1989, pp. 1280-1286.
I. Ohkura et al., "Gate Isolation—A Novel Basic Cell Configuration for CMOS Gate Arrays", IEEE (1982), pp. 307-310.
H. Fukuda et al., "A CMOS Pair-Transistor Array Masterslice", pp. 16-17.
R. Blumberg et al., "Aluminum Screen Gives Superior Power Distribution in a Sea-of-Gates Array" (1988), pp. 16-19.

*Primary Examiner*—Andrew J. James
*Assistant Examiner*—Courtney A. Bowers
*Attorney, Agent, or Firm*—Lowe, Price, LeBlanc, Becker & Shur

[57] ABSTRACT

An improved carpeting gate array having a plurality of basic cells (9) each comprising an N channel MOS transistor (8) and a P channel MOS transistor (7) continuously arranged in row and column directions comprises a logic cell region (20) comprising a plurality of basic cells (9) continuously formed in a channel width direction (a direction intersecting with a direction in which their gate electrodes (4) of a plurality of N channel or P channel MOS transistors are continuously arranged spaced apart from each other), and an interconnection region (21) for providing interconnections to the logic cells (20) continuously formed in the channel width direction. The size in a width direction of the interconnection region is defined by the size in a channel length direction (a direction intersecting with the channel width direction) of the basic cells (9).

20 Claims, 14 Drawing Sheets

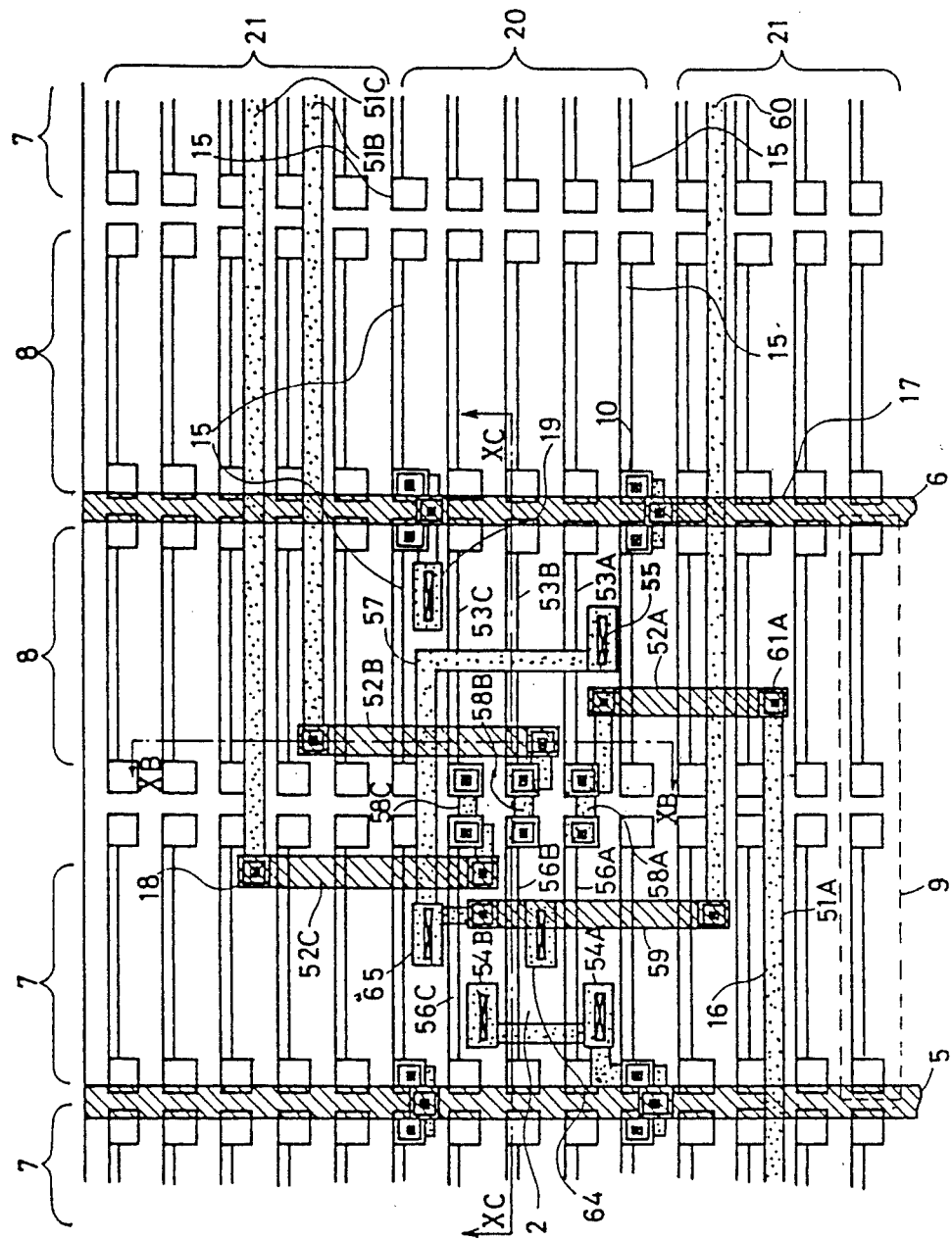

INTERCONNECTION ARRANGEMENT FOR A GATE ARRAY

BACKGROUND OF THE INVENTION

1. Field of the Invention

The present invention relates generally to gate arrays, and more particularly, to an arrangement of logic cell regions and interconnection regions for such arrays.

2. Description of the Background Art

A gate array comprises gates referred to as basic cells arranged orderly and regularly (in an array manner) on an LSI (large-scale integrated circuit) chip. The gate array is an LSI designed by significantly standardizing designing, developing and manufacturing processes of a custom LSI to make the most of the CAD (computer aided design) and manufactured by means in a semi-custom manner. In the gate array, the developing period and the manufacturing cost can be reduced, although the chip size is increased, as compared with a full-custom LSI. Thus, the gate array has been improved and developed for higher performance and a higher function since the gate array was put into practice in the early 1970's.

Following are approaches for enhancing performance, particularly, increasing integration density of the gate array:

(a) pattern miniaturization (b) improvement of chip architecture (method for arranging basic cells and method for arranging interconnection regions)

(a) Miniaturization is conventionally used as a means for increasing integration density of the LSI including a dynamic memory and hence, the detailed description thereof is omitted.

(b) Chip architecture is an item peculiar to the gate array. Taking a CMOS (complementary metal oxide semiconductor) gate array as a concrete example, the following are principal methods of chip architecture improvement:

(b-1) gate isolation (b-2) carpeting gate array (b-1) Gate isolation is related to a transistor isolating method. FIG. 1A is a plan view showing an isolated state of each gate to occur when employing a field oxide film method which is the most general transistor isolating method, and FIG. 1B is a cross sectional view showing a portion taken along a line IB—IB in FIG. 1A. Referring to FIGS. 1A and 1B, a conventional gate array using a field oxide film comprises a field oxide film 31 for isolating transistors, P type source-drain regions 2, N type source-drain regions 3, gates 4 of MOS transistors, a $V_{DD}$ line 5, a GND power-supply line 6, P channel transistor 7 and N channel transistors 8. A basic cell serving as an element in assembling system circuits comprises two sets of P channel transistors and N channel transistors. Since the transistors are isolated by the field oxide film 31, this field oxide film method has the following disadvantages:

(a) Since two sets of P channel transistors and N channel transistors constitute a basic cell, the size of the basic cell is fixed.

(b) As shown in FIG. 1B, peripheral portions 33 of the field oxide film 31 formed by LOCOS extends to the active regions. These portions are called bird's beaks. Since bird's beaks 33 appear in both ends of the field oxide film 31, the distance between cells is increased.

In order to overcome this disadvantage, the gate isolation was invented. The gate isolation is a method in which transistors respectively having channels of the same conductivity type are not isolated by the field oxide film. FIG. 2A is a plan view showing a gate array subjected to gate isolation, and FIG. 2B is a cross sectional view showing a portion taken along a line IIB—IIB in FIG. 2A. As shown in FIGS. 2A and 2B, a P type source-drain diffusion region 2 and an N type source-drain diffusion region 3 are formed in a stripe shape without a field oxide film. Thus, the transistors are structured in a column (array) manner. A basic cell 9 in the gate isolation method comprises one set of P channel transistor and N channel transistor, as represented by a dotted line in FIG. 2A. Isolation between the transistors is achieved by fixing a gate 4 at a $V_{DD}$ level by a gate contact 10 in the P channel transistor while fixing a gate 4 at a GND level by a gate contact 10' in the N channel transistor. In this method, integration is improved, as compared with the oxide film isolating method. This method is described in an article by I. Ohkura, entitled "Gate Isolation-A Novel Basic Cell Configuration for CMOS Gate Array", CICC 82, 1982, pp. 307-310.

Hereinafter, the direction of the X-axis (in which channels of the same conductivity type are continuously arranged) in FIG. 2A is referred to as a channel length direction of the basic cell, and the direction of the Y-axis (in which gates are continuously arranged) is referred to as a channel width direction of the basic cell.

(b-2) Carpeting is considered as a second generation of the gate array. FIG. 3 is a diagram of a master chip in a conventional gate array. In FIG. 3, the conventional gate array comprises basic cell columns 11 each having basic cells 9 arranged therein, field oxide films 12 each used as an interconnection channel region between logic cells, and input/output buffer and pad regions 14. The width of each of the field oxide films 12 each used as an interconnection channel region is set to a width in which several and several tens of interconnection tracks can be laid out such that a desired circuit can be laid out by the CAD. A carpeting gate array (referred to as SOG-Sea of Gate hereinafter) was invented for effective arrangement and interconnection in the gate array. FIG. 4 is a plan view of the SOG. In FIG. 4, basic cell columns 11 are carpeted also in a region where the field oxide films 12 exist in FIG. 3. Portions other than the region are the same as those in FIG. 3. The details thereof are described in an article by H. Fukuda, entitled "A CMOS Pair-Transistor Array Masterslice", Digest of VLSI Symposium 82, 1982, pp. 16-17.

As shown in FIG. 4, a semiconductor substrate having a plurality of PMOS transistors and NMOS transistors formed therein is referred to as a master chip.

FIG. 5A is a symbol showing a 3 input NAND circuit, and FIG. 5B is a diagram showing an equivalent circuit of the 3 input NAND circuit. Reference numerals in FIG. 5B correspond to reference numerals in FIG. 6A. FIG. 6A is a plan view showing the 3 input NAND circuit shown in FIG. 5B formed on a gate array. FIG. 6B is a cross sectional view showing a portion taken along a line VIB—VIB in FIG. 6A, and FIG. 6C is a cross sectional view showing a portion taken along a line VI—VI in FIG. 6A. Referring to FIGS. 6A, 6B and 6C, the 3 input NAND circuit is formed on regions isolated by isolating gates 15 on a logic cell column 20.

In FIG. 6A, the 3 input NAND circuit comprises three N channel MOS transistors 53A, 53B and 53C connected in series and P channel MOS transistors 56A, 56B and 56C connected in parallel. The three P channel MOS transistors 56A, 56B and 56C connected in parallel are connected to a $V_{DD}$ line 5 through contacts 54A and 54B. The three N channel MOS transistors 53A, 53B and 53C connected in series are connected to a GND line 6 through a contact 19. An input signal A (see FIGS. 5A and 5B) is applied to gates of the N channel MOS transistor 53A and the P channel MOS transistor 56A through interconnections 51A, 52A and 58A. Similarly, an input signal B is applied to gates of the N channel MOS transistor 53B and the P channel MOS transistor 56B through interconnections 51B and 52B. An input signal C is applied to gates of the N channel MOS transistor 53C and the P channel MOS transistor 56C through interconnections 51C and 52C.

A source region of the N channel MOS transistor 53A is connected to output signal lines 59 and 60 through a contact 55 and an interconnection 57, as shown in FIG. 6A. Drain regions 2 of the three P channel MOS transistors 56A, 56B and 56C are connected to the output signal lines 59 and 60 through the contact 54B, an interconnection 62 and the interconnection 57. In FIG. 6A, interconnections on a first layer are represented by dots, and interconnections on a second layer are represented by oblique lines.

In FIG. 6A, a basic cell column 9 is used as a logic cell column 20 for assembling circuits or interconnection channel regions 21 for interconnections between logic cells.

Meanwhile, in the conventional gate array shown in FIG. 3, the number of tracks to be interconnected which can be provided in each of the interconnection channel regions 12 on the oxide film is fixed to, for example, 30. However, the respective numbers of tracks to be interconnected in all channels need not be necessarily the same. Thus, in order to utilize the basic cell column as a logic cell, the number of tracks to be interconnected must be less than the number of tracks provided in the interconnection channel region.

FIG. 7A is a plan view showing an actual layout pattern of the SOG comprising the logic circuit as shown in FIG. 6A which is viewed in a macro manner. A portion where right and downward oblique lines are drawn represents a logic cell region 13, a square symbol 18 represents a through hole between metal interconnections, a straight line 16 parallel to the direction of the X-axis represents a first metal interconnection layer, and a straight line 17 parallel to the direction of the Y-axis represents a second metal interconnection layer. A plurality of basic cell columns out of the basic cell columns 11 as carpeted are respectively used as logic cell columns 20, and basic cells 9 in the basic cell columns used as the logic cell columns are respectively used as logic cells. The basic cell columns 11 which exist above and below each of the logic cell columns 20 are respectively used as interconnection channel regions 21 in order to ensure the number of tracks required for interconnections between the logic cells. Thus, in the SOG, the degree of freedom for the layout by the CAD is increased. Therefore, as compared with the gate array shown in FIG. 3, integration is improved. However, if there is one track to be interconnected which cannot be contained in a interconnection channel region in one column, another interconnection channel region 21 is required for the one track to be interconnected. Thus, there remains a useless interconnection region.

In order to overcome this disadvantage, a method has been devised for decreasing the length in the channel width direction of each of the basic cell columns. In the SOG, the above described basic cell columns 11 are respectively used as the interconnection channel regions 21. Thus, if the number of tracks to be interconnected for each basic cell column is 30, each of the interconnection channel regions can be changed every 30 tracks (which is referred to as track pitch 30 hereinafter). For example, if 32 tracks to be interconnected are required in a given interconnection channel region 21, two basic cell columns 11 are utilized as the interconnection channel region 21. However, the efficiency of the use of tracks is very low, i.e., 32/60. If the number of tracks for each basic cell column is decreased from 30 to 20, the track pitch is decreased to 20, so that the efficiency of the use of tracks is improved to be 32/40.

Even if such a method has been revised, there is still useless interconnection regions. The background of generation of such useless regions will be described briefly in the following.

FIG. 7B is an enlarged view of a basic cell 9 constituting the SOG shown in FIG. 7A. Generally, the length and width of one basic cell are determined, one such example shown in FIG. 7B. Referring to FIG. 7B, the length and width of a conventional basic cell are about 50 $\mu$ and about 5 $\mu$, respectively. In this manner, the ratio of the length and width of the basic cell (hereinafter referred to as a aspect ratio) has been determined in general, which was about 10:1 to 5:1. The said dimension is defined by the dimension of two transistors constituting the basic cell. More specifically, a prescribed gate width is necessary to provide a prescribed driving power of the transistor and, in addition, prescribed dimensions of the source drain regions are necessary. Under such conditions, the length of a portion corresponding to the gate width of the basic cell (the dimension represented by 1 in FIG. 7B) cannot be freely changed.

Referring to FIGS. 7B and 7C, the reason why an interconnection layer 17 has been provided for every 1 basic cell will be described. In FIG. 7C, the interconnection layer 17 is shown in the same scale as in FIG. 7B. Referring to FIG. 7C, the width of the interconnection layer 17 is about 2 $\mu$ and the pitch is about 3.5 $\mu$. Accordingly, referring to FIGS. 7B and 7C, one interconnection layer 17 is provided approximately on one basic cell.

In the above described gate array, SOG and standard cell, a system is configured by combining required logic cells from several hundred types of groups of circuits (cell libraries) as previously assembled. Thus, in logic cells entered into the cell libraries, interconnections between transistors in the logic cells have been already accomplished. Thus, when a chip (system) is configured, interconnections are only provided between the logic cells. In arrangement and interconnection, it is desirable to completely isolate interconnection regions in the logic cells from interconnection regions between logic cells. Poly-cell is an effective method for making the heights of the logic cells approximately constant. Thus, regions suitable for the interconnections between the transistors in the logic cells are required. As a result, the height of a column of the MOS transistors, i.e., the channel width of the transistors cannot be decreased without any restriction, so that the channel width of at least 4 to 5 tracks is required.

FIG. 8 is an enlarged plan-view of a portion encircled by VIII in FIG. 4. Referring to FIG. 8, in the conventional improved carpeting gate array, through holes 73 each serving as an input/output of a logic cell may be interconnected as shown. On this occasion, second metal interconnection layers 17 are arranged as shown since it must be taken out in interconnection channel regions 21. Consequently, interconnections in a portion represented by A are close to each other, so that it is difficult to provide another interconnection in this region. In this case, when a through hole 71 on one logic cell column 20A and a through hole 72 on the other logic cell column 20B must be interconnected with each other, for example, a straight interconnection cannot be provided from the through hole 71 to the through hole 72, so that the interconnection must be bypassed as represented by 74.

SUMMARY OF THE INVENTION

An object of the present invention is to solve the above described problems and to provide a gate array in which a track pitch can be changed by the small value corresponding to the short dimension of a basic cell, rather than by the large dimension of the basic cell in order to interconnect cells with each other such that there is no wasted interconnection region.

Another object of the present invention is to provide a carpeting gate array making a highly efficient use of logic cell regions.

Still another object of the present invention is to provide a gate array making highly efficient use of logic cell regions and divided by a field oxide film.

The above described objects of the present invention can be attained by a gate array in accordance with the present invention, comprising: a substrate having a major surface; a plurality of basic cells each having a length greater than its width, cells aligned with each other longitudinally and arranged continuously on the major surface of the substrate in rows; interconnection channels having the width formed selectively between the cells and extending in the direction of the rows; and interconnection wiring in the channels and extending in the direction of the rows for interconnecting selected ones of the cells.

Since the width and the extending direction of the interconnection channel are the same as those of the basic cells, the basic cells can be used as the interconnection channels. The width of the basic cell is smaller than the length of the basic cell. Therefore, a track pitch corresponding to the width of the interconnection channel can be changed by the small value corresponding to the short dimension of the basic cell.

In accordance with a preferred embodiment of the present invention, the present invention is directed to a carpeting gate array having a plurality of basic cells continuously arranged in a first direction and a second direction intersecting with the first direction, each of the basic cells comprising an NMOS transistor and a PMOS transistor, each of the NMOS transistor and the PMOS transistor including a gate electrode and a channel region, the respective gate electrodes being arranged aligned in the first direction, the distance between the gate electrodes arranged adjacent to each other in the second direction defining the size in the length direction of the channel region, comprising a plurality of logic cell regions for constituting a plurality of logic cells and an interconnection region for connecting the plurality of logic cell regions to each other, the interconnection region having a predetermined width, and the predetermined width of the interconnection region being defined by the size in the length direction of the channel region.

Since the carpeting gate array is structured as described above, the width of the interconnection region can be changed for each size in the length direction of the channel region. As a result, there can be provided a carpeting gate array having high efficiency of the use of the logic cell regions.

In accordance with a still preferred embodiment of the present invention, a logic cell unit comprises at least two units, a gate array comprises a plurality of logic cell units and the logic cell units are arranged spaced apart from each other in first and second directions.

Since the gate array is structured as described above, the present invention is applied to a gate array employing a field oxide film method. As a result, there can be provided a gate array having high efficiency of the use of logic cell regions employing a field oxide film method.

In the gate array according to the present invention, a master slice including basic cells in the SOG is rotated by 90° with respect to the conventional master slice. Logic cells are continuously formed in a channel width direction, i.e., a gate length direction, and interconnections connecting a plurality of logic cells are provided along the gate length direction.

Since the direction of the interconnections between the logic cells in the gate array according to the present invention coincides with the gate length direction, the width of each interconnection channel region can be changed every arrangement pitch in the channel length direction of the basic cells.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10A is a diagram showing a mask pattern showing a 3 input NAND gate formed on a carpeting master chip using gate isolation;

DESCRIPTION OF THE PREFERRED EMBODIMENT

Figure 9:
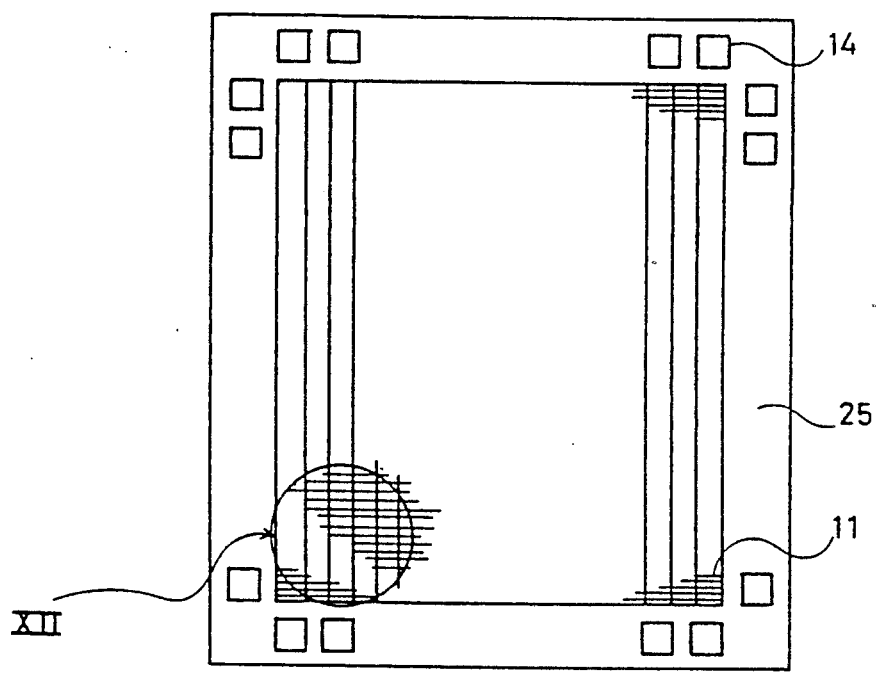
FIG. 9 is a plan view showing a carpeting master chip according to the present invention using gate isolation.

FIG. 9 is a diagram showing a carpeting master slice according to the present invention using gate isolation. FIG. 9 shows a master slice obtained by rotating the conventional carpeting master slice by 90°. A master chip 25 according to the present invention comprises basic cell columns 11 and input buffer and pad regions 14, as in the conventional example.

Figure 4:
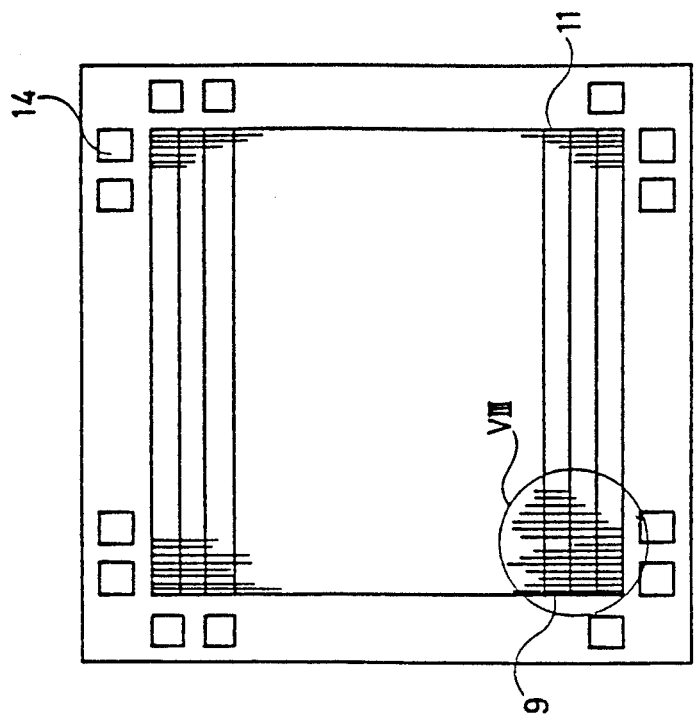
FIG. 4 is a plan view showing a carpeting gate array.
Figure 3:
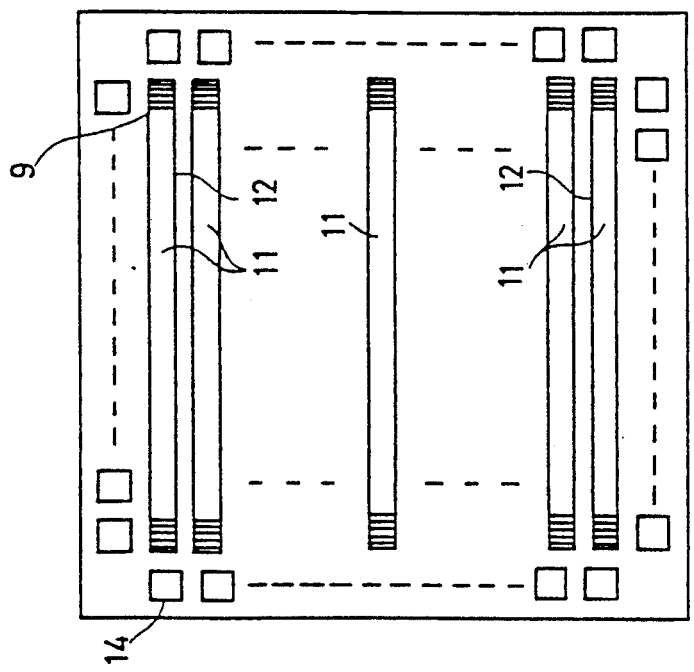
FIG. 3 is a diagram showing a master chip in a conventional gate array.
Figure 5A:
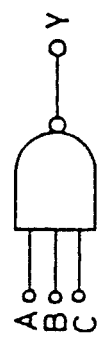
FIG. 5A is a symbol showing a 3 input NAND circuit.
Figure 5B:
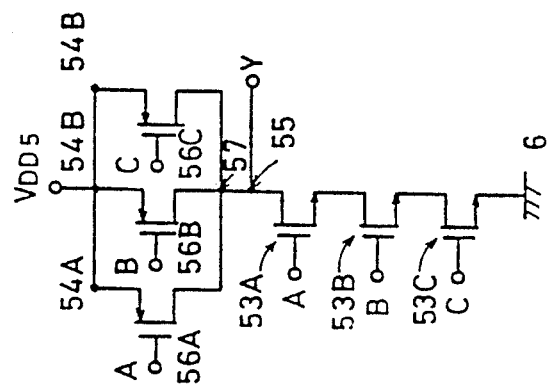
FIG. 5B is a diagram showing an equivalent circuit of the 3 input NAND circuit.
Figure 6A:
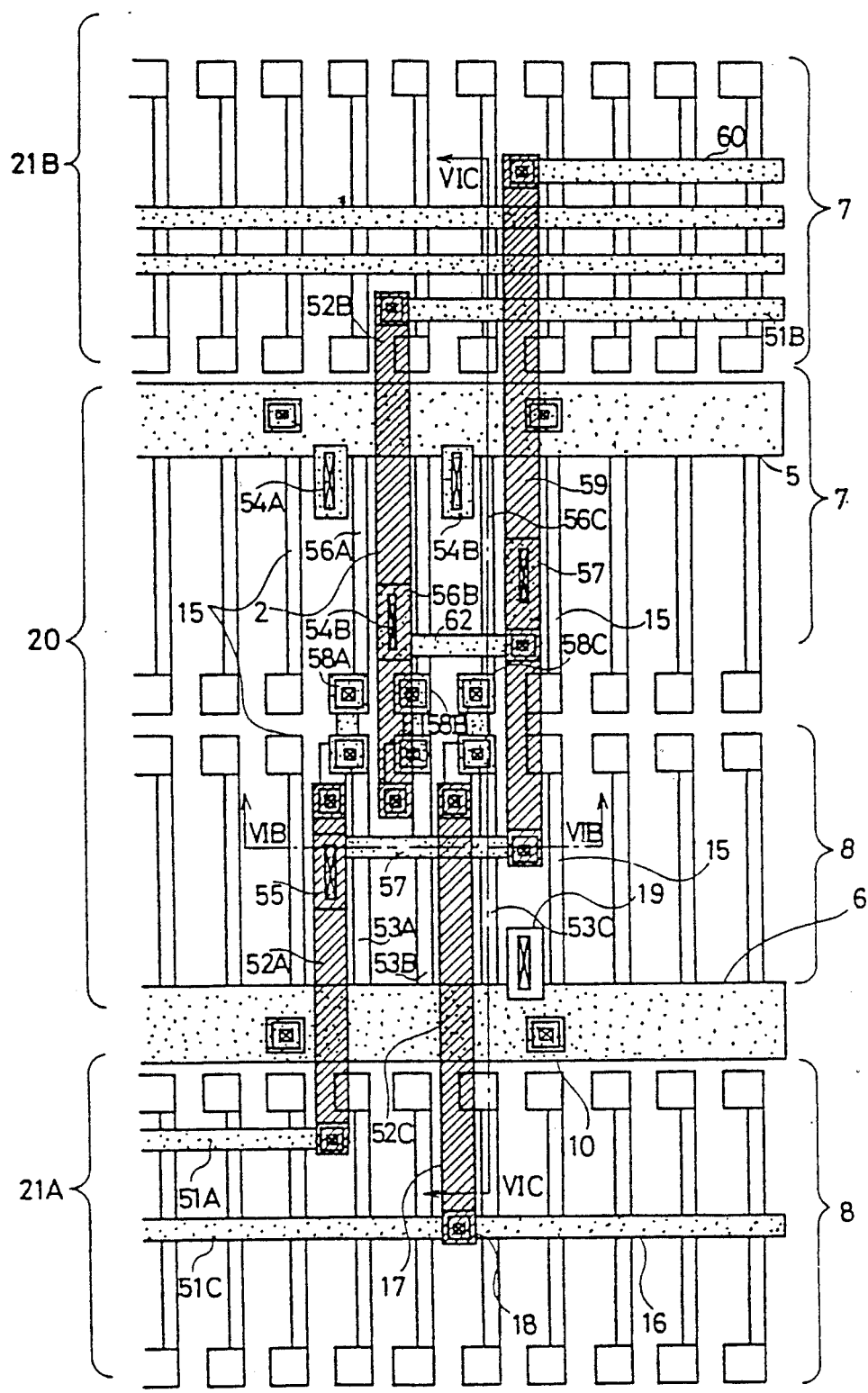
FIG. 6A is a plan view showing the 3 input NAND circuit formed on the gate array.
Figure 6B:
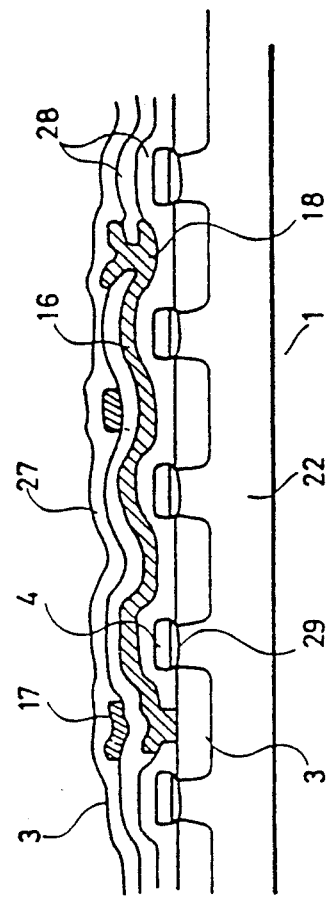
FIG. 6B is a cross sectional view of a portion taken along a line VIB—VIB in FIG. 6A.
Figure 6C:
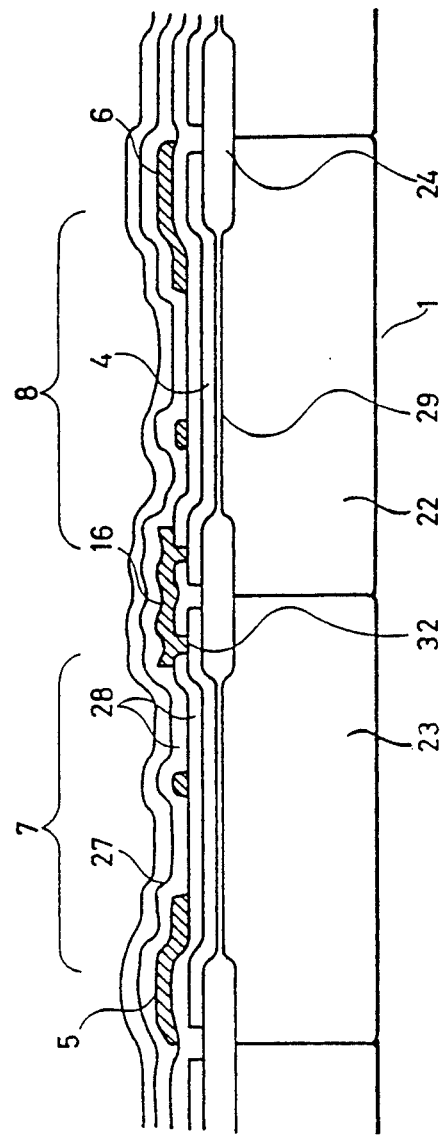
FIG. 6C is a cross sectional view of a portion taken along a line VIC—VIC in FIG. 6A.
Figure 10B:
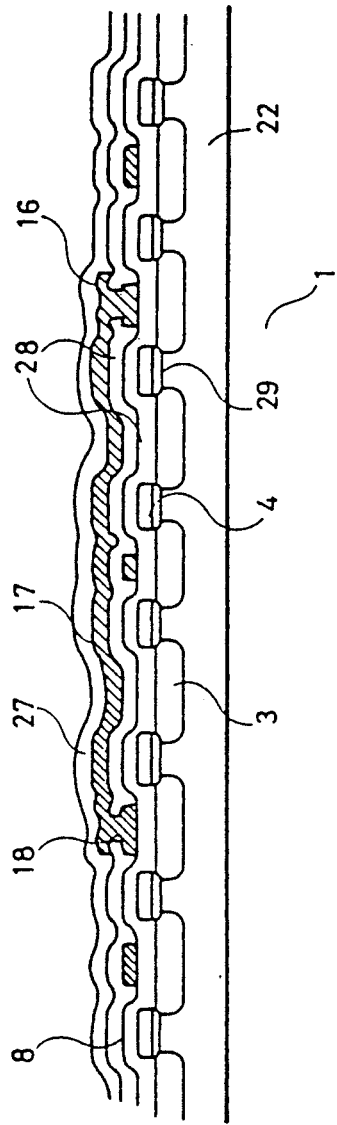
FIG. 10B is a cross sectional view of a portion taken along a line XB—XB in FIG. 10A.
Figure 10C:
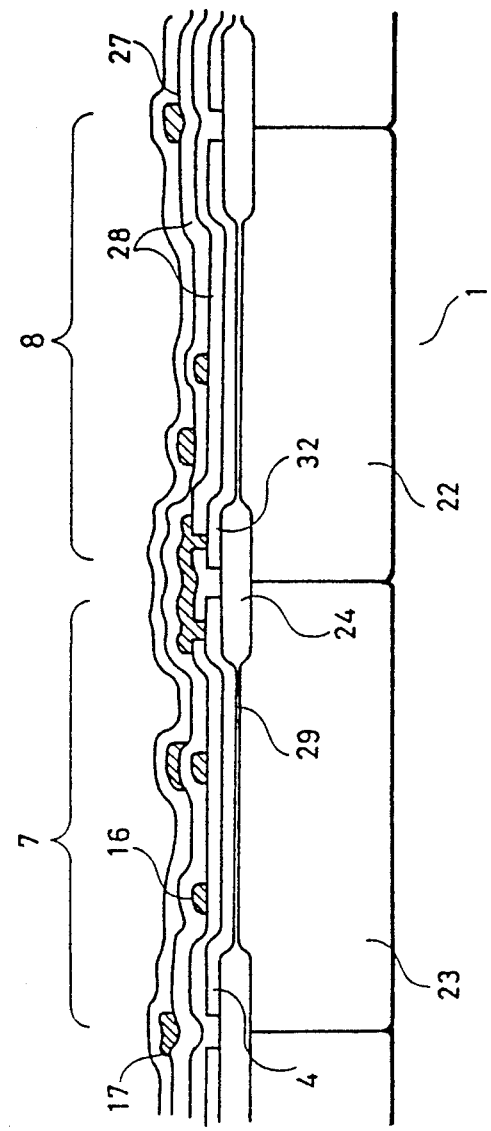
FIG. 10C is a cross sectional view of a portion taken along a line XC—XC in FIG. 10A.

FIG. 10A is a diagram showing a mask pattern showing a 3 input NAND gate circuit shown in FIG. 5A and 5B formed on a carpeting master chip using gate isolation, FIG. 10B is a cross sectional view of a portion taken along a line XB—XB in FIG. 10A, and FIG. 10C is a cross sectional view of a portion taken along a line XC—XC in FIG. 10A. In FIG. 10A, a 3 input NAND circuit similar to that in FIG. 6A is formed on a master chip in which the directions of the X-axis and the Y-axis of the carpeting master slice shown in FIG. 4 are replaced with each other. Thus, as compared with FIG. 6A, logic cell columns and interconnection channel regions are rotated by 90°, respectively. Referring to FIGS. 10A, 10B and 10C, the 3 input NAND circuit according to the present invention comprises three N channel MOS transistors 53A, 53B and 53C connected in series and three P channel MOS transistors 56A, 56B and 56C connected in parallel. The three P channel MOS transistors 56A, 56B and 56C connected in parallel are connected to a $V_{DD}$ 5 through contacts 54A and 54B. The three N channel MOS transistors 53A, 53B and 53C connected in series are connected to a GND 6 through a contact 19. An input signal A is applied to gates of the N channel MOS transistor 53A and the P channel MOS transistor 56A through interconnections 51A, 52A and 58A. Similarly, an input signal B is applied to gates of the N channel MOS transistor 53B and the P channel MOS transistor 56B through interconnections 51B, 52B and 58B. An input signal C is connected to gates of the N channel MOS transistor 53C and the P channel MOS transistor 56C through interconnections 51C, 52C and 58C. A source region of the N channel MOS transistor 53A is connected to output signal lines 59 and 60 through a contact 55 and an interconnection 57. The two P channel MOS transistors 56A and 56B and a drain region 2 of the P channel MOS transistor 56C are connected to the output signal lines 59 and 60 through contacts 64 and 65, respectively.

In FIG. 10A, interconnections on a first layer are represented by dots, and interconnections on a second layer are represented by oblique lines.

Figure 7A:
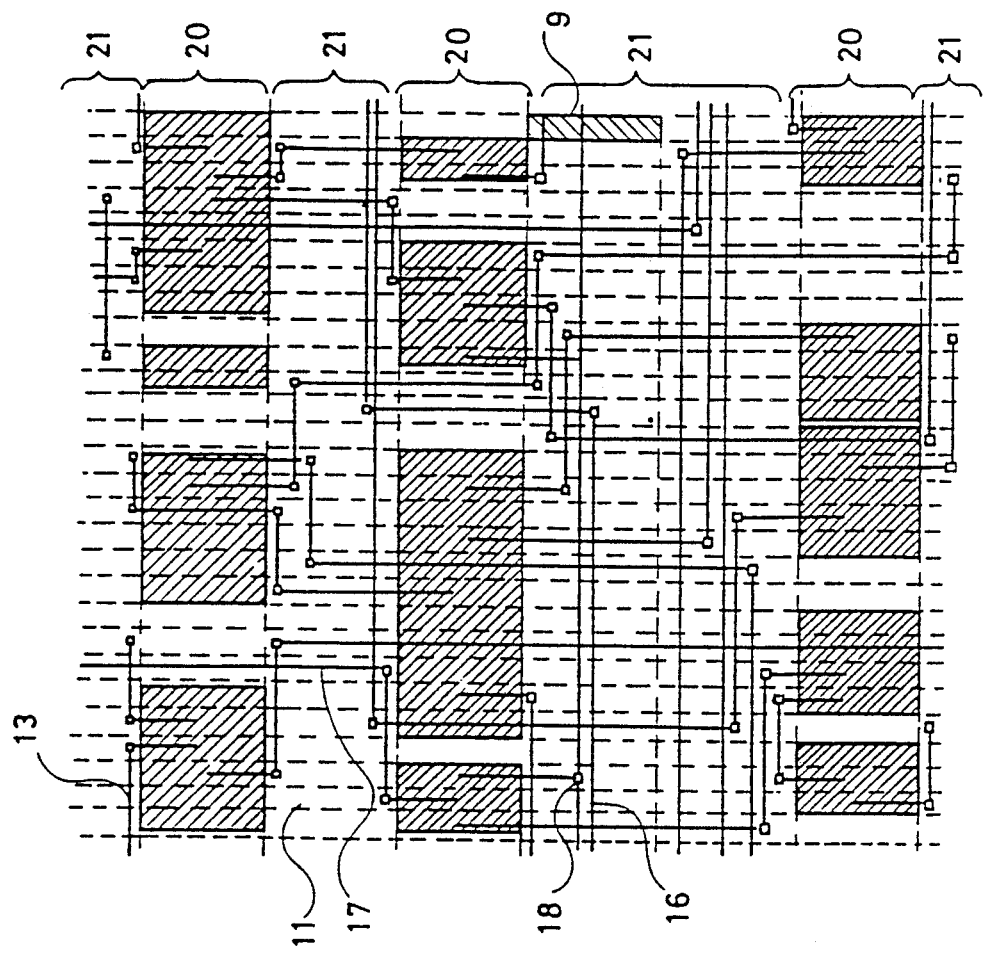
FIG. 7A is a plan view showing an actual layout pattern of an SOG comprising a logic circuit as shown in FIG. 6A which is viewed in a macro manner.
Figure 7B:
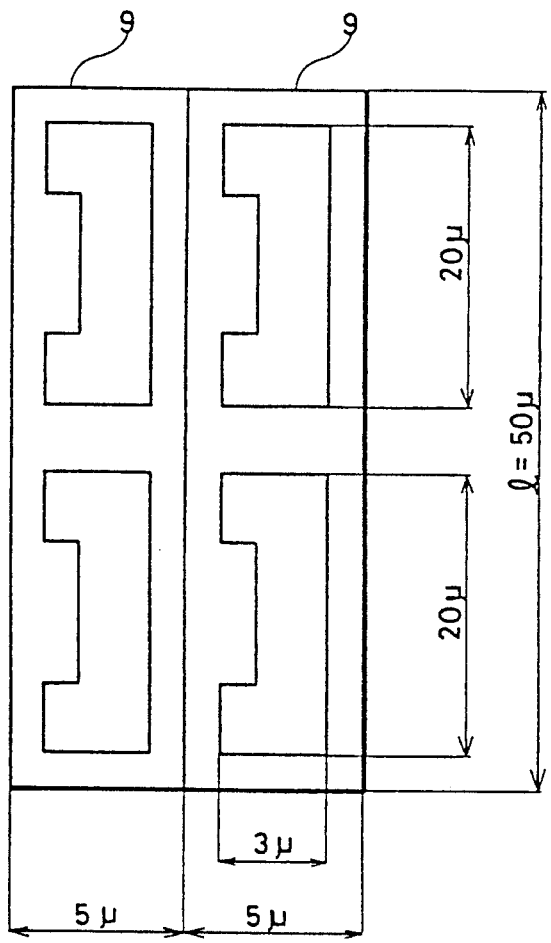
FIG. 7B and 7C are enlarged views of the basic cells and interconnection layers showing the dimensions.
Figure 7C:
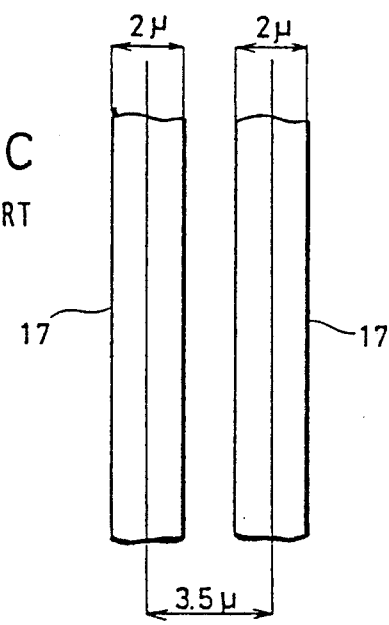
Figure 8:
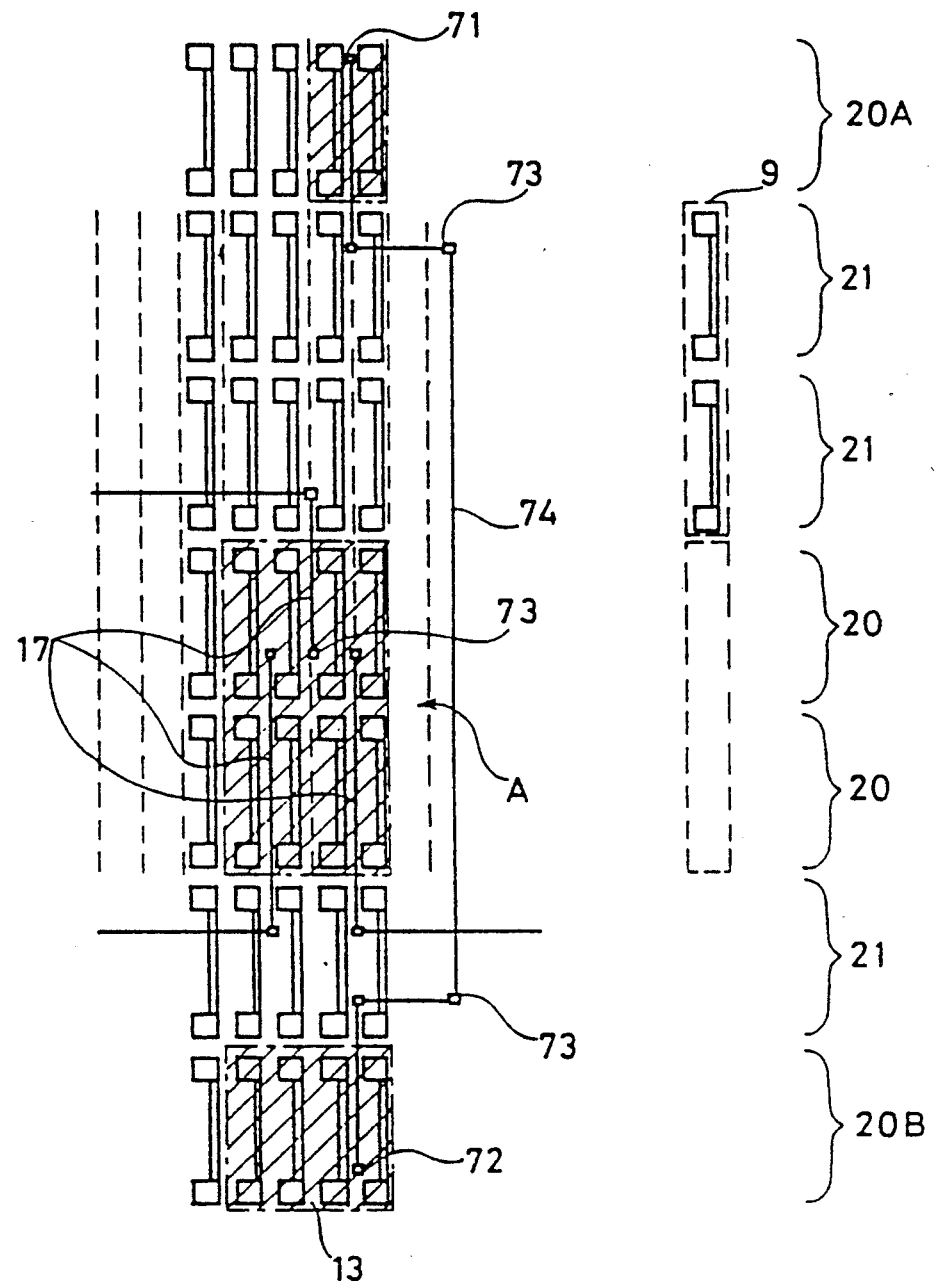
FIG. 8 is an enlarged plan view of a portion encircled by VIII in FIG. 4.
Figure 12:
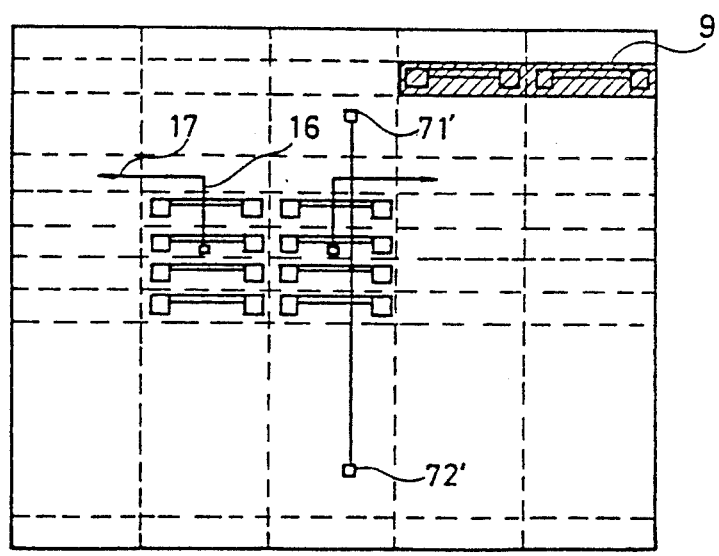
FIG. 12 is an enlarged view showing a portion by XII in FIG. 9 where interconnections are provided.
Figure 11:
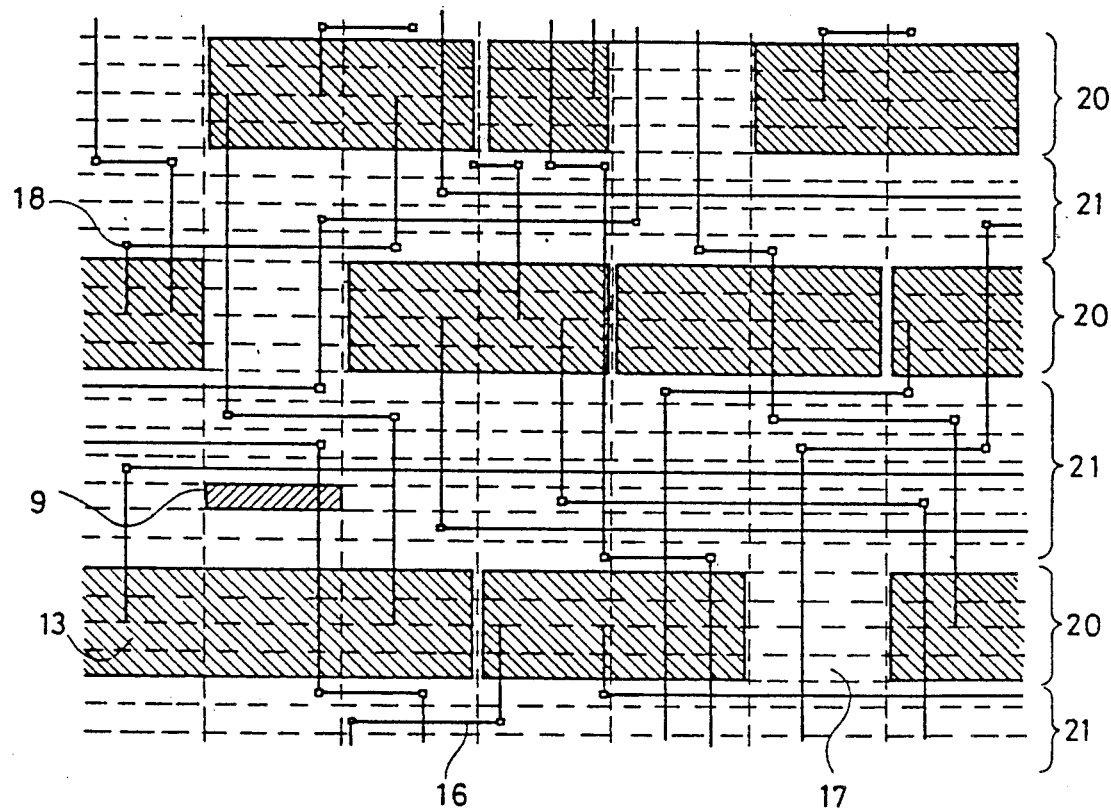
FIG. 11 is a plan view showing an actual layout pattern of an SOG comprising a logic circuit which is viewed in a macro manner.

FIG. 11 is a plan view showing an actual layout pattern of an SOG comprising a logic circuit as shown in FIG. 10A which is viewed in a macro manner. As obvious from FIG. 11, the direction of interconnection regions coincides with a channel width direction, so that the interconnection regions can be increased or decreased every one column. More specifically, the width of each of interconnection channel regions 21 are equal to an arrangement pitch between basic cells each comprising an MOS transistor, so that the width of the interconnection channel region can be adjusted to the same degree as that in a standard cell. As a result, from comparison of FIG. 11 with FIG. 7, the interconnection regions can be effectively utilized. FIG. 12 is an enlarged view showing a portion encircled by XII in FIG. 9 where interconnections are provided. Referring to FIG. 12, logic cells are continuously formed in the channel width direction. Thus, even if there exist a plurality of through holes 73 to the logic cells, it is necessary to take out interconnections up to an adjacent basic cell column from the logic cells. Thus, a portion does not appear in which interconnections are close to each other due to the conventional plurality of logic cells as shown in FIG. 8. Therefore, a region can be ensured which has no interconnection to be taken out and through which a second metal interconnection layer can pass. Consequently, straight interconnections can be provided, so that the interconnections need not be bypassed.

In the foregoing, the embodiment was described by referring to a case of a 3 input NAND circuit. A 3 input NOR circuit can also be made by changing connections in FIG. 10.

Figure 13:
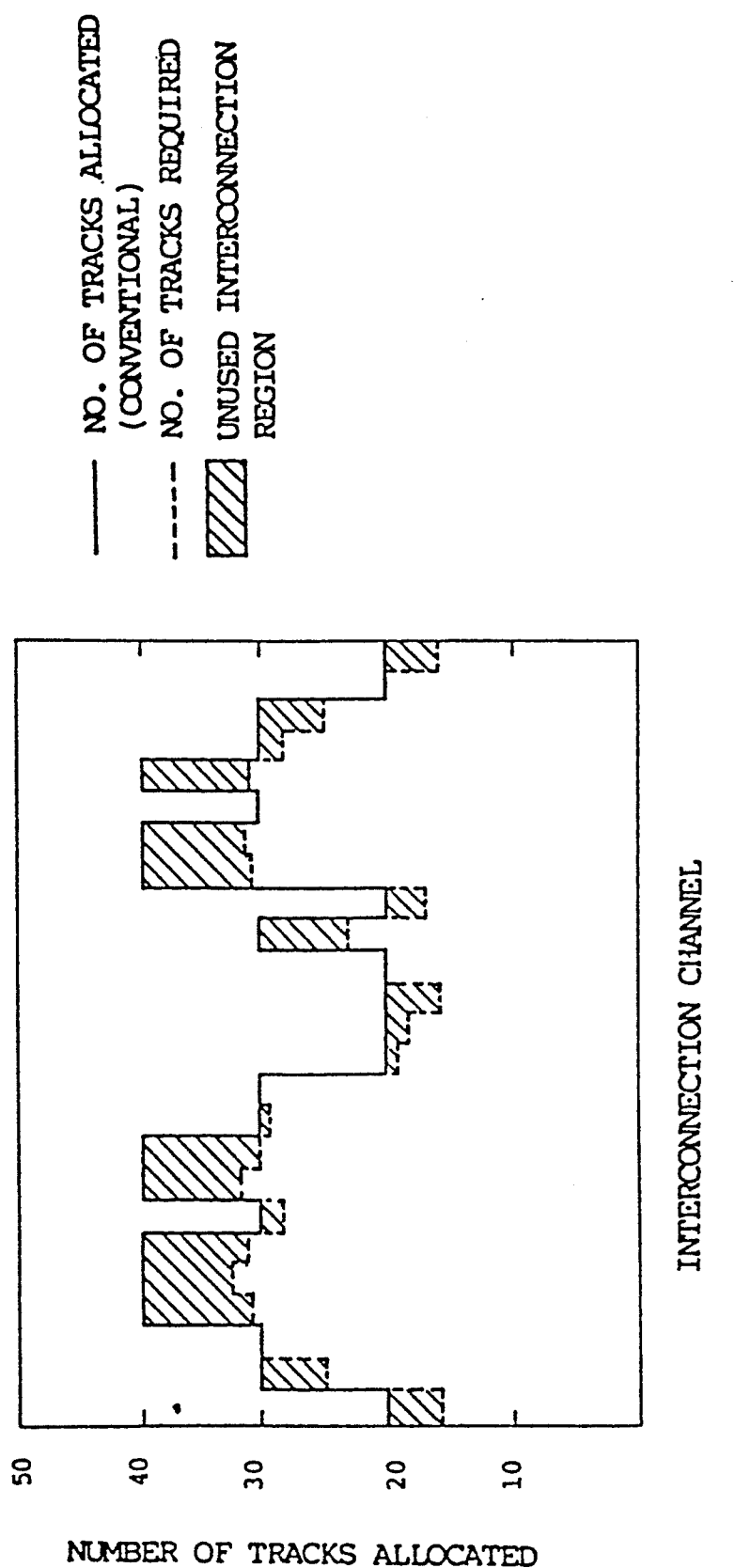
FIG. 13 is a diagram showing the difference between efficiencies of the use of interconnection channel regions to occur when interconnections are provided using the conventional SOG and when interconnections are provided using an interconnecting method according to the present invention.

FIG. 13 is a diagram showing the difference between the efficiencies of the use of interconnection channel regions to occur when interconnections are provided using the conventional SOG and when interconnections are provided using an interconnecting method according to the present invention. The axis of ordinate represents the number of tracks allocated to each interconnection channel region, and the axis of abscissa represents the interconnection channel. It is assumed that the smallest number of tracks allocated to the interconnection channel region is 10. The dotted line corresponds to the number of tracks required when interconnections are provided using the interconnecting method according to the present invention, and the solid line corresponds to the number of tracks allocated when interconnections are provided using the conventional method. When the interconnecting method according to the present invention is employed, interconnecting tracks and basic cell columns are in one-to-one correspondence to each other, so that the number of basic cell columns required in and the number of tracks assigned to each of the interconnection channel regions coincide with each other. Referring to FIG. 13, when interconnections are provided using the conventional method, there occurs no unused interconnection region, which is useless, represented by oblique lines, as compared with a case in which the interconnecting method according to the present invention is employed. More specifically, if the interconnecting method according to the present invention is employed, the efficiency of the use of the area on the master chip is significantly improved.

Figure 1A:
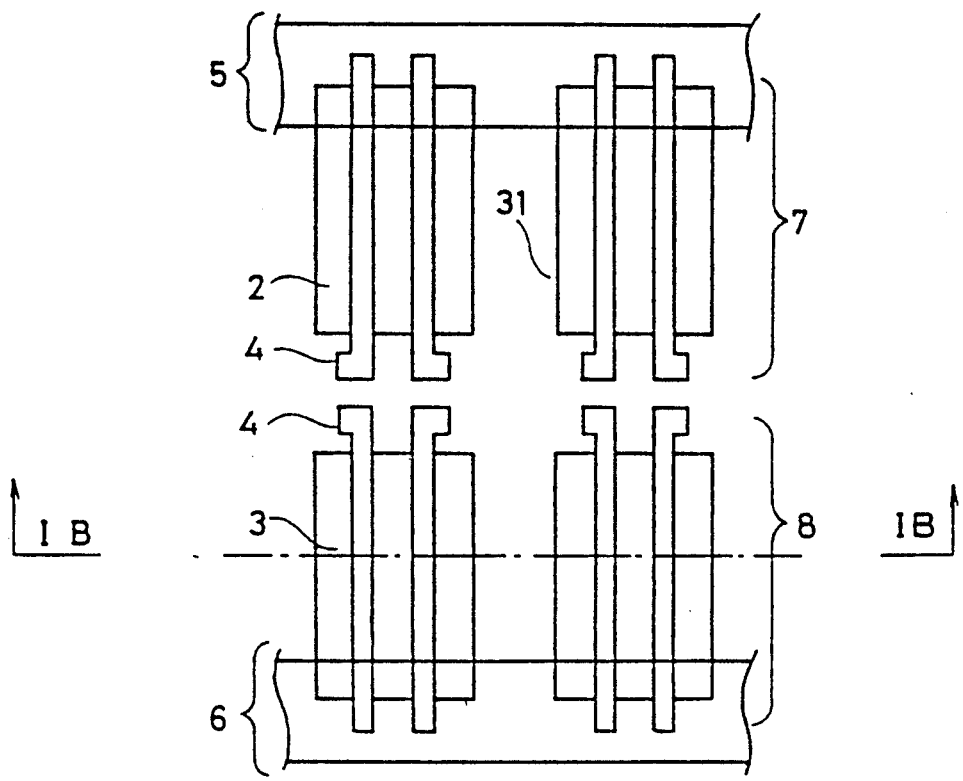
FIG. 1A is a plan view showing an isolated state of each gate to occur when a field oxide film method is employed.
Figure 1B:
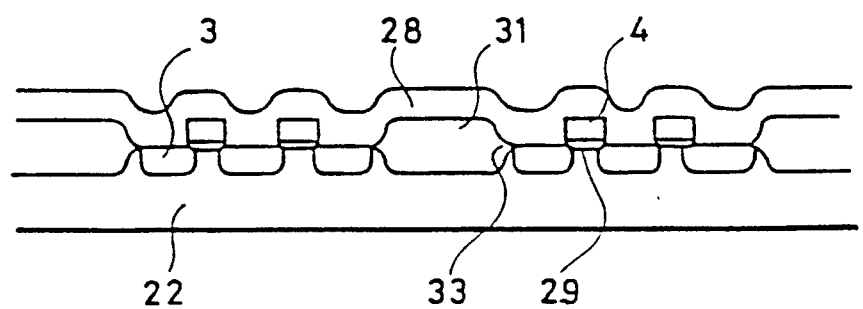
FIG. 1B is a cross sectional view of a portion taken along a line IB—IB in FIG. 1A.
Figure 2A:
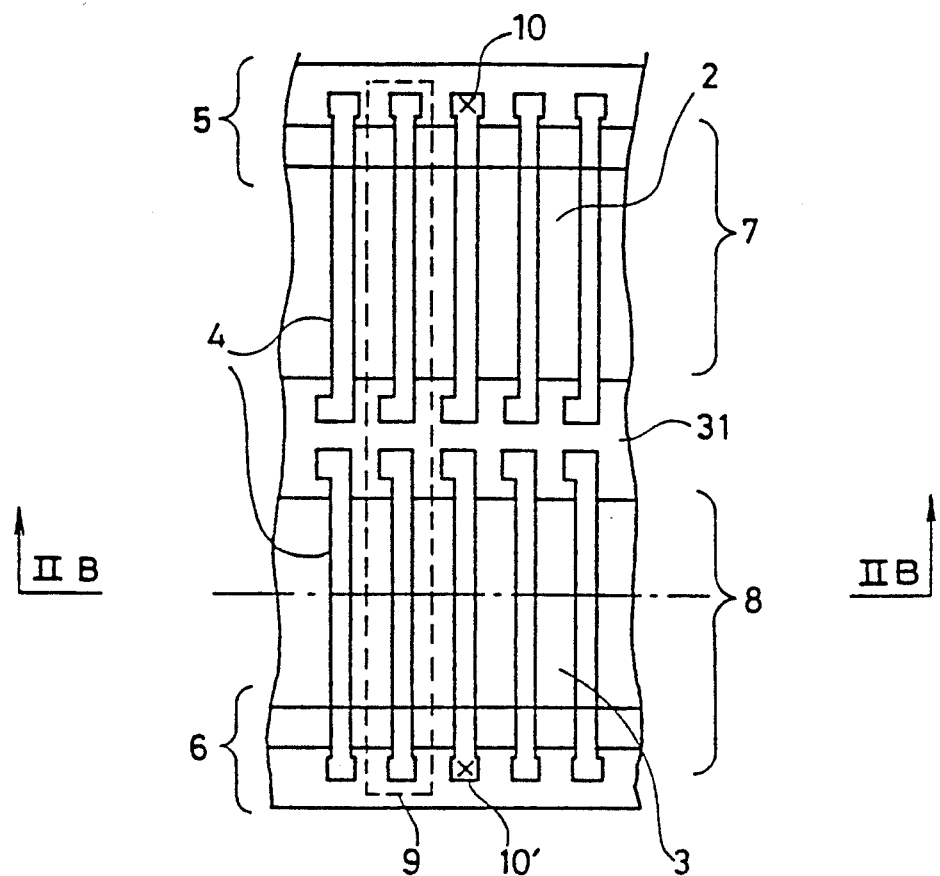
FIG. 2A is a plan view showing a gate array subjected to gate isolation.
Figure 2B:
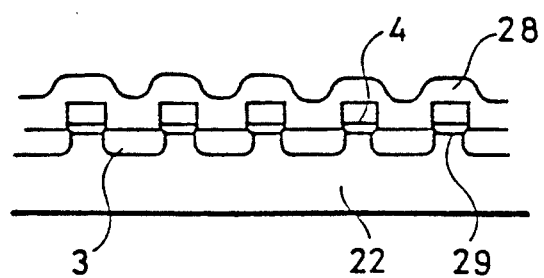
FIG. 2B is a cross sectional view of a portion taken along a line IIB—IIB in FIG. 2A.
Figure 14:
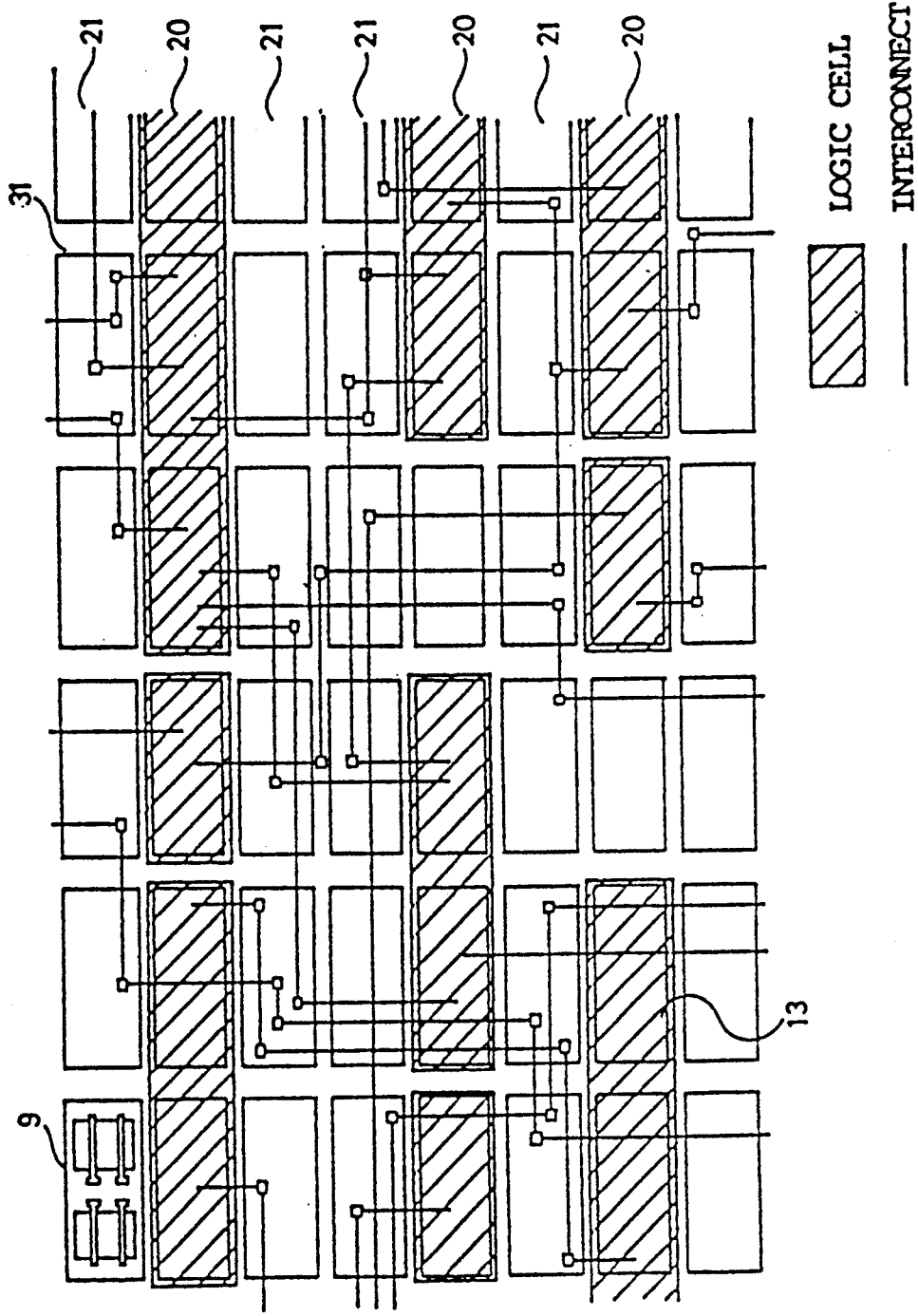
FIG. 14 is a plan view showing a gate array in an oxide film isolating method to which the present invention is applied.

FIG. 14 is a plan view showing a gate array in the conventional oxide film isolating method shown in FIGS. 1A and 1B to which the present invention is applied. Referring to FIG. 14, a gate array to which the present invention is applied comprises a plurality of logic cell columns 20 continuously formed in the channel width direction, i.e., the gate length direction, and a plurality of interconnection channel regions 21 arranged parallel to the logic cell columns 20 for connecting the plurality of logic cell columns 20. Since the interconnection channel regions 21 are formed parallel to the logic cell columns 20, interconnecting columns can be easily adjusted by changing the number of interconnecting tracks. As a result, the smallest size allocated to the tracks can be decreased, so that the unused interconnection regions can be decreased.

As described in the foregoing, the gate array according to the present invention, a carpeting master chip is used by rotating the conventional master chip by 90°, a plurality of logic cells are continuously formed in the channel width direction, i.e., the gate length direction, and the interconnections connecting the logic cells are provided along the gate length direction. Thus, the width of interconnection channel regions can be changed every arrangement pitch in the channel length direction of basic cells, so that unused interconnection regions can be decreased. As a result, there can be provided a gate array which can effectively utilize the area on the master chip.

Thus, a region can be ensured which has no interconnection to be taken out and through which a second metal interconnection layer can pass, so that straight interconnections can be provided, whereby the interconnections need not be bypassed.

Although the present invention has been described and illustrated in detail, it is clearly understood that the same is by way of illustration and example only and is not to be taken by way of limitation, the spirit and scope of the present invention being limited only by the terms of the appended claims.

WHAT IS CLAIMED IS:
1. A gate array, comprising:
a substrate having a major surface (1);
a plurality of basic cells (9) each having a length greater than its width, said cells aligned with each other longitudinally and arranged continuously on said major surface of said substrate (1) in rows;
interconnection channels (21) having said width formed selectively between said cells and extending in the direction of said rows; and
interconnection wiring (16) in said channels and extending in the direction of said rows for interconnecting selected ones of said cells.
2. The gate array according to claim 1, wherein said plurality of basic cells constitute logic cells.
3. A gate array, comprising:
a substrate having a main surface (1);
a plurality of basic cell regions (9) arranged on said main surface of said substrate in row and column directions to form a matrix, each said basic cell region (9) having a first region forming a given conductivity type field effect device and a second region forming an opposite conductivity type field effect device, said first and second regions being arranged to be aligned in the row direction, the row directional length of each said basic cell region being larger than the column directional length of each said basic cell region;
a plurality of logical circuit element groups (20) having logical circuit elements including a plurality of said basic cell regions;
a plurality of interconnection regions (21) arranged between said logical circuit element groups, each region comprising a row of said basic cell regions; and
an interconnection layer (17) formed through an insulator on said interconnection regions.
4. In a gate array, comprising:
a substrate (1) having a major surface,
a plurality of impurity regions of a first conductivity type (7) formed to extend in a first direction, spaced apart from each other on the major surface of said substrate and each having a predetermined width,
a plurality of impurity regions of a second conductivity type (8) formed to extend in said first direction in a region of said substrate apart from said plurality of impurity regions of the first conductivity type and having a predetermined width,
a plurality of first conductive layers (56A, 56B, 56C) formed through an insulating film and spaced apart from each other in said first direction on said impurity regions of the first conductivity type,
a plurality of second conductive layers (53A, 53B, 53C) formed through an insulating film and spaced apart from each other in said first direction on said impurity regions of the second conductivity type,
said first conductive layers (56A, 56B, 56C) and said second conductive layers (53A, 53B, 53C) being formed aligned with each other in a second direction intersecting with said first direction, and each said first conductive layer and each said second conductive layer which are formed adjacent to each other and said impurity regions of the first and second conductivity types provided on both sides of said first and second conductive layers constituting a logic cell unit (9),
whereby a plurality of logic cell units are formed spaced apart from each other in said first direction to constitute a column of said units (7, 8), a plurality of said columns of said units being formed,
the improvement wherein,
said logic cell units being continuously formed in at least said second direction,
a plurality of interconnection regions each comprising a plurality of said logic cell units aligned in said second direction, and
conductive layers (60) continuously formed in said second direction on one or more of said interconnection regions for connecting said plurality of logic cell units to each other.
5. The gate array according to claim 4, wherein said first conductivity type of said impurity regions (7) differs from said second conductivity type of said impurity regions (8).
6. The gate array according to claim 5, wherein said plurality of said columns of units are formed adjacent to each other, and the impurity region of the second conductivity type of one column and the other column in two adjacent columns face each other.

7. The gate array according to claim 6, wherein said first and second conductive layers (53A, 53B, 53C, 56A, 56B, 56C) and said impurity regions (7) (8) of the first and second conductivity types form field effect devices.

8. The gate array according to claim 7, wherein said field effect devices comprise field effect transistors.

9. The gate array according to claim 4, wherein said plurality of logic cell units (9) constitute a logic cell.

10. The gate array according to claim 9, wherein at least one said logic cell (9) comprises a NAND gate.

11. The gate array according to claim 9, wherein at least one said logic cell (9) comprises a NOR gate.

12. The gate array according to claim 5, wherein said first and second conductive layers (53A, 53B, 53C, 56A, 56B, 56C) comprise polysilicon layers, respectively.

13. The gate array according to claim 5, wherein said plurality of said columns of units (7) (8) are formed adjacent to each other, and the impurity region of the first conductivity type of one column (23) and the impurity region of the second conductivity type of the other column (24) in two adjacent columns face each other.

14. The gate array according to claim 13, wherein said first and second conductive layers and said impurity regions of the first and second conductivity types form field effect devices.

15. The gate array according to claim 14, wherein said field effect devices comprise field effect transistors.

16. A carpeting gate array having a plurality of basic cells (9) continuously arranged in a first direction and a second direction intersecting with said first direction, each of said basic cells comprising an NMOS (8) transistor and a PMOS (7) transistor; each of said NMOS (8) transistor and said PMOS (7) transistor comprising a gate electrode (4) and a channel region; the respective gate electrodes (4) being arranged aligned in said first direction; the distance between said gate electrodes arranged adjacent to each other in said second direction defining the size in a length direction of the channel regions, said array comprising a plurality of logic cell regions (20) comprising a plurality of basic cells and an interconnection region (21) for connecting said plurality of logic cell regions to each other, said interconnection region having a predetermined width, and the predetermined width of said interconnection region being defined by the size of one basic cell in the length direction of said channel regions.

17. The gate array according to claim 16, wherein said logic cell regions are arranged spaced apart from each other in said first and second directions.

18. The gate array according to claim 4, wherein said first and second conductive layers comprise gate electrodes (4), respectively, said impurity regions of the first and second conductivity types comprise each one of an N type impurity layer (23) and a P type impurity layer (24), respectively, said gate electrodes (4) and said N type or P type impurity layer (22) (23) constitute a MOS transistor, and one logic cell unit comprises a unit of the MOS transistor.

19. The gate array according to claim 18, wherein said plurality of logic cell units constitute a single logic cell.

20. The gate array according to claim 17, wherein said gate electrodes comprise polysilicon layers.

* * * * *